United States Patent [19]
Damon et al.

[11] 3,932,820
[45] Jan. 13, 1976

[54] CROSSED FIELD AMPLIFIERS
[75] Inventors: Lionel Damon; Brian Philip Scoffield, both of Malvern, England
[73] Assignee: The British Secretary of State for Defense, London, England
[22] Filed: July 8, 1974
[21] Appl. No.: 486,740

[30] Foreign Application Priority Data
July 6, 1973 United Kingdom............ 32202/73

[52] U.S. Cl............................. 330/43; 315/39.71
[51] Int. Cl.²........................................ H03F 3/58
[58] Field of Search ......... 315/39.71, 39.3; 330/43

[56] References Cited
UNITED STATES PATENTS
3,300,681 1/1967 Bessarab .................. 315/39.71
3,454,824 7/1969 Owaki et al................. 315/39.71
3,560,867 2/1971 Hess.............................. 330/43
3,588,600 6/1971 Nakayama..................... 315/326

FOREIGN PATENTS OR APPLICATIONS
1,929,143 12/1970 Germany ....................... 330/43

Primary Examiner—Nathan Kaufman
Attorney, Agent, or Firm—Elliott I. Pollock

[57] ABSTRACT

The noise in a crossed field amplifier output is reduced by providing a non-uniform magnetic field across the surface of the cathode. This may be achieved by providing a curved magnetic field across the cathode or by providing a concave shaped cathode. Additionally the cathode may be tilted with respect to the cross magnetic field.

6 Claims, 5 Drawing Figures

CROSSED FIELD AMPLIFIERS

This invention relates to crossed field amplifiers generally and to injected beam crossed field amplifiers in particular.

In these injected beam amplifiers, electrons emitted from a cathode interact with a radio frequency electromagnetic wave i.e. RF signals to cause an amplification of the RF signal. Such amplifiers are capable of a high power output, for example 500 kW peak pulsed power, and have compact overall dimensions. This is particularly useful in modern radar transmitters.

A crossed field amplifier, as used herein, is defined as a structure along which RF signals pass while interacting with an electron stream from the emitting surface of a cathode which stream imparts energy to the RF signals thereby amplifying the signals, the structure being arranged in a magnetic field which crosses the direction of movement of RF signal and electron stream, the majority of the interaction region being bounded by two spaced electrodes between which a potential difference is maintained, such electrodes being so arranged that the resulting electric field is perpendicular both to the magnetic field and to the general direction of movement of the RF signal and electron stream.

For some time it had been assumed that a highly uniform magnetic field was necessary for satisfactory operation of the amplifier. Even with such a uniform magnetic field and careful design the predicted high gain and efficiency of crossed field amplifiers was not realized because of broad band noise found in the RF output. Consequently little use has been made of these amplifiers in modern radar systems.

It has previously been found that, for low power crossed field amplifiers, a reduction in noise is obtained by causing a uniform component of magnetic field normal to the cathode or emitting surface. This was achieved by tilting the cathode or by small solenoids. Such tilt gives a uniform component of magnetic field normal to the cathode across the whole of its surface.

An object of this invention is to reduce the broad band noise in crossed field amplifiers.

According to this invention a crossed field amplifier, as defined herein, includes a shaped cathode and anode, means for causing the cathode to emit a stream of electrons for interaction with RF signal, and means for causing a non-uniform magnetic field across the surface of the cathode.

The non-uniform magnetic field may include a component normal to the surface of the cathode which component varies across the width of the cathode. This variation of the component may be arranged to give a maximum at the side edges of the cathode and a minimum at its center.

The non-uniform field may also include a variation in strength or intensity of magnetic field across the surface of the cathode.

A crossed field amplifier of this invention comprises two spaced electrodes, between which an electric potential field may be applied, a radio frequency signal input for feeding input signals between the two electrodes at one end thereof, a radio frequency signal output for collecting the signal from between the electrodes, a cathode emitter and anode between which an electric potential field may be applied to cause the cathode to emit electrons from a surface, an evacuated envelope containing the two electrodes, the cathode, and the anode, a magnetic field system for causing a uniform magnetic field perpendicular to the two electric potential fields, whereby electrons emitted from the cathode are caused to travel between the two electrodes perpendicular to the magnetic field to interact with the radio frequency signals and provide amplification thereof, and further comprises means for causing a non-uniform magnetic field component normal to the cathode emitting surface which component varies across the cathode surface whereby noise in the radio frequency signal output is reduced.

The invention will now be described by way of example only with reference to the accompanying drawings in which.

Figure 1:
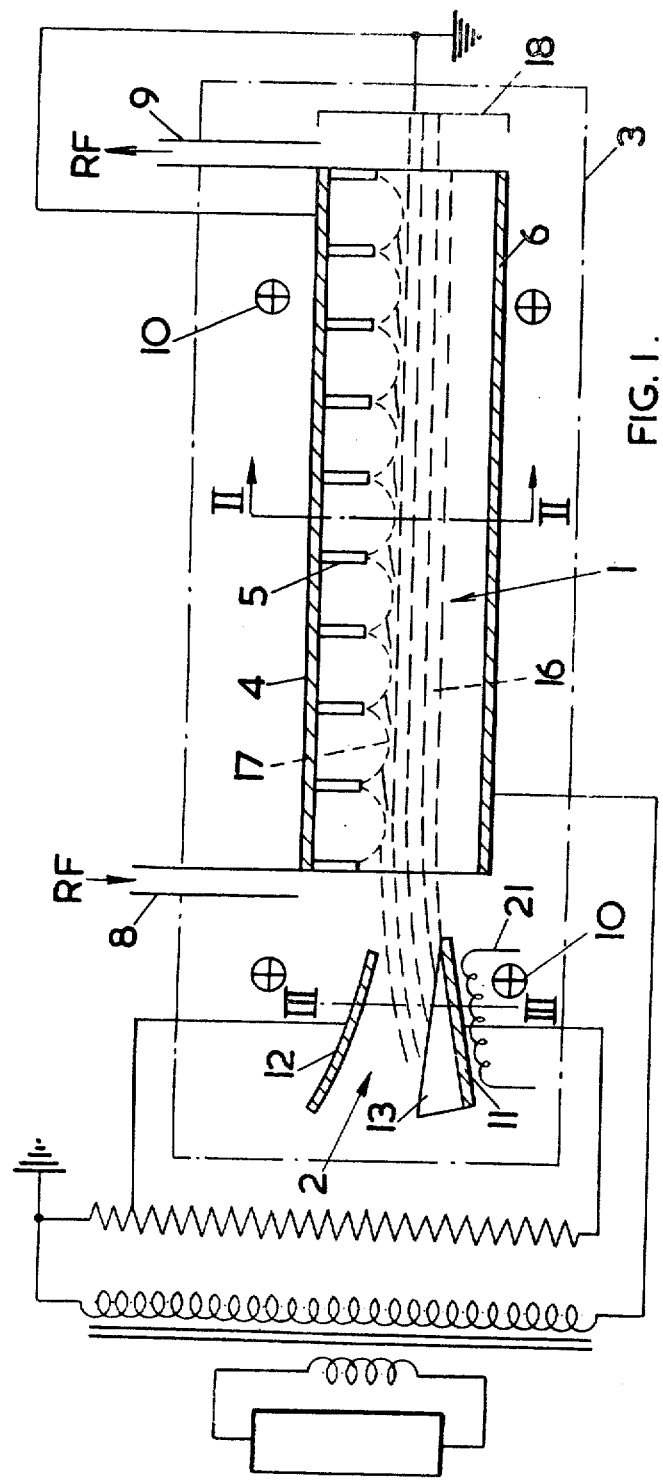
FIG. 1 shows diagrammatically an injected beam crossed field amplifier and circuit.
Figure 2:
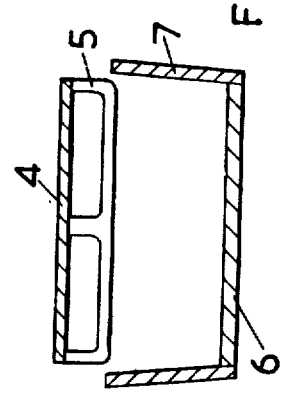
FIG. 2 is a view on the line II—II of FIG. 1.
Figure 3:
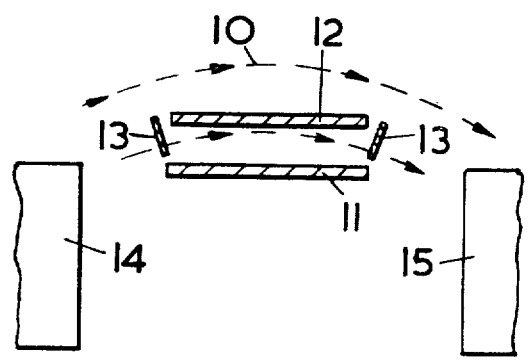
FIG. 3 is a view on the line III-III of FIG. 1.

As shown diagrammatically in FIGS. 1, 2 and 3, an injected beam crossed field amplifier comprises two sections, an interaction section 1 and a gun section 2, both mounted in an evacuated envelope 3.

The interaction section 1 has guiding structures for electromagnetic waves consisting of an electrode line plate 4 from which water cooled rungs 5 are dependent. Below the line plate 4 and spaced therefrom is an electrode or sole plate 6 provided with a grooved surface (not shown) to reduce secondary electron emission. Side plates 7 are provided (as seen in FIG. 2) to contain electrons. RF signals enter via an inlet 8 and after amplification leave via an outlet 9. A collector 18 is arranged across the end of the interaction section 1. The whole of the travelling wave section 1 is located within a uniform magnetic field, typically 2,000 Gauss, as indicated at 10.

The gun section 2 comprises a cathode 11 heated by a heater 21, and an anode 12 with side, beam confining, electrodes 13 arranged at approximately cathode potential. The cathode 11 may be inclined at about 10° to the length of the travelling wave section 1. The magnetic field as shown at 10, extends across the gun section 2.

Figure 4:
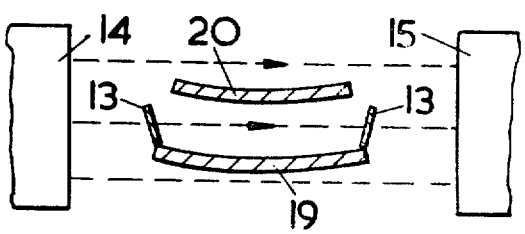
FIG. 4 is a sectional view showing an alternative construction to that of FIG. 3.

The poles 14 and 15 of magnets for supplying the magnetic field in the travelling wave and gun sections are shown in FIGS. 3 and 4. The shape and position of these poles may be modified in the gun section 2 in a manner which produces curvature of the magnetic field as shown in FIG. 3 or to produce a variation in intensity across the width of the cathodes 11, 19. The poles may be stepped in the gun section 2 to provide the curved field. The variation in intensity may be produced by reducing the height of the poles in the gun section 2.

In the presence of magnetic field 10 a voltage, typically 15kV, is applied between the anode 12 and heated cathode 11. This results in a stream of electrons 16 directed into the travelling wave section 1 where they interact with the RF signal 17. The RF signal is thus amplified and extracted. Electrons not previously interacted with the RF signal are collected by the collector 18.

One problem with the injected beam crossed field amplifier is noise in the RF signal output. This noise is believed to originate, to a large extent, in the gun section 2, particularly in the vicinity of the cathode 11 surface.

As shown in FIGS. 1, 3 the emitting surface or cathode 11 is planar. Above it and at an angle is a shaped anode 12. As seen in FIG. 1 the applied magnetic field strength is constant over the length of the cathode (i.e. constant along the general direction of electron flow). However, as shown by FIG. 3, the magnetic field is non-uniform across the surface of the cathode 11, the lines of magnetic field being indicated at 10 as curved.

FIG. 4 shows an alternative construction in which the cathode 19 and the anode 20 are curved while the applied magnetic field 10 is straight. However, relative to the surface of the cathode 19 the magnetic field 10 is curved.

Thus as shown in FIGS. 3, 4 the cathode 11 (or 19) experiences a non-uniform magnetic field component perpendicular to its emitting surface. This perpendicular component is seen to be at a maximum at the sides of the cathode and a minimum at its center. The curvature of magnetic field has been found to give maximum noise reduction when the magnetic field vector at the sides of the cathode 11, 19 is about 1°.

Arrangement of the cathode to experience a non-uniform magnetic field across its surface as shown in FIGS. 3 and 4 has been found to reduce noise in the RF output by, typically, up to 15dB.

The non-uniform field across the cathode may be achieved in other ways, for example by variation in the windings of the magnets, additional magnets and shaping of the poles of the magnets.

Figure 5:
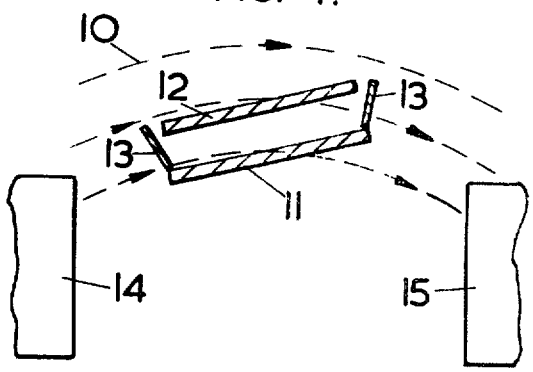
FIG. 5 shows a modification to FIG. 3.

FIG. 5 shows (in an exaggerated style) how noise may further be reduced by tilting the cathode 11 and also applying a non-uniform magnetic field across the cathode 11. The angle of tilt has been found, on the devices so far tested, to show a maximum noise reduction of up to 15dB at a tilt angle of 1° when the magnetic field is uniform across the cathode 11. Such tilting of course produces a uniform magnetic field normal to the cathode 11. When in addition to tilt the magnetic field is non-uniform, e.g. curved, the noise reduction has been found to be up to 30 dB. The cathode may be concave as in FIG. 4 and a straight magnetic field used.

Instead of tilting the cathode a uniform magnetic field, normal to the cathode 11, may be obtained by use of a solenoid mounted outside the envelope 3 to give a vertical magnetic field of about 30 Gauss (when the cross field is about 2,000 Gauss).

Further improvements in noise reduction may be achieved by holding the side electrodes 13 at about −300V relative to the cathode 11 potential. This reduces noise by up to 15 dB. Unfortunately insulation between cathode 11 and side electrodes 13 is difficult.

An amplifier constructed as described above may be used with continuous wave or pulsed wave RF input.

The power output is typically several Megawatts peak down to several watts continuous power with an RF amplification of about 20 dB, and signal to noise ratio around 75 dB.

Experiments have been made with magnetic field 10 curved the opposite way to that shown in FIG. 3, and also with cathodes made convex as opposed to the concave cathode 19, FIG. 4. Such constructions gave no reduction in noise.

I claim:

1. A crossed field amplifier comprising two spaced electrodes means for applying a first electric potential field between said two electrodes, a radio frequency signal input for feeding input signals between said two electrodes at one end thereof, a radio frequency signal output for collecting the signal from between the electrodes, a cathode and anode disposed in spaced relation to one another adjacent one end of said two spaced electrodes, means for applying a second electric potential field between said cathode and anode to cause the cathode to emit electrons from a surface thereof, an evacuated envelope containing the two electrodes, the cathode, and the anode, a magnetic field system for producing a uniform magnetic field perpendicular to each of said first and second electric potential fields, whereby electrons emitted from the cathode are caused to travel between the two electrodes perpendicular to said magnetic field to interact with the radio frequency signals and provide amplification thereof, said magnetic field system including means for producing a non-uniform magnetic field component normal to said electron emitting surface of said cathode which component varies across said cathode surface whereby noise in the radio frequency signal output is reduced.

2. A crossed field amplifier according to claim 1 wherein the cathode emitter surface is flat and the magnetic field across the cathode emittor surface is curved.

3. A crossed field amplifier according to claim 1 wherein the cathode emitter surface is concave.

4. A crossed field amplifier according to claim 1 wherein means are provided to produce an additional uniform magnetic field component perpendicular to the cathode emitter surface.

5. A crossed field amplifier according to claim 4 wherein the additional uniform magnetic field component is produced by shaped pole pieces in said magnetic field system.

6. A crossed field amplifier according to claim 4 wherein the additional uniform magnetic field component is produced by a solenoid.

* * * * *

UNITED STATES PATENT AND TRADEMARK OFFICE
CERTIFICATE OF CORRECTION

PATENT NO. : 3,932,820
DATED : January 13, 1976
INVENTOR(S) : Lionel Damon et al It is certified that error appears in the above-identified patent and that said Letters Patent are hereby corrected as shown below:

In the Heading please correct the name of the assignee to:

-- The Secretary of State for Defence in Her Britannic Majesty's Government of the United Kingdom of Great Britain and Northern Ireland, London, England --

Signed and Sealed this

Twenty-eighth Day of September 1976

[SEAL]

Attest:

RUTH C. MASON
Attesting Officer

C. MARSHALL DANN
Commissioner of Patents and Trademarks